(12) United States Patent
Matsunaga

(10) Patent No.: US 9,105,544 B2
(45) Date of Patent: Aug. 11, 2015

(54) SOLID-STATE IMAGING DEVICE

(71) Applicant: PANASONIC CORPORATION, Osaka (JP)

(72) Inventor: Yoshiyuki Matsunaga, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 263 days.

(21) Appl. No.: 13/722,135

(22) Filed: Dec. 20, 2012

(65) Prior Publication Data

US 2013/0113060 A1 May 9, 2013

Related U.S. Application Data

(63) Continuation of application No. PCT/JP2011/003948, filed on Jul. 8, 2011.

(30) Foreign Application Priority Data

Jul. 9, 2010 (JP) ................................ 2010-157289

(51) Int. Cl.
*H01L 29/10* (2006.01)
*H01L 21/00* (2006.01)
(Continued)

(52) U.S. Cl.
CPC .... *H01L 27/14632* (2013.01); *G02F 1/136227* (2013.01); *H01L 27/14636* (2013.01);
(Continued)

(58) Field of Classification Search
CPC .................. H01L 27/14632; H01L 27/14643; H01L 27/14636; H01L 27/14638; H01L 27/3262; H01L 27/3272; H01L 27/3248; H01L 27/14665; G02F 1/136227; G02F 1/136286
See application file for complete search history.

(56) References Cited

U.S. PATENT DOCUMENTS

| 4,363,963 | A | 12/1982 | Ando |
| 6,243,155 | B1 * | 6/2001 | Zhang et al. .................. 349/199 |

(Continued)

FOREIGN PATENT DOCUMENTS

| JP | 55-120182 A | 9/1980 |
| JP | 09-275201 A | 10/1997 |

(Continued)

OTHER PUBLICATIONS

Japanese Office Action issued in Corresponding Japanese Application No. 2010-157289, dated Jan. 14, 2014.
(Continued)

*Primary Examiner* — Alonzo Chambliss
(74) *Attorney, Agent, or Firm* — McDermott Will & Emery LLP

(57) ABSTRACT

A solid-state imaging device including unit pixel cells, each having a photoelectric conversion film and a pixel electrode which are formed above a silicon substrate, an amplification transistor which is formed on the silicon substrate and outputs a voltage according to a potential of the pixel electrode, and a reset transistor which is formed on the silicon substrate and resets a potential of a gate electrode of the amplification transistor, the imaging device including a vertical signal line which is disposed correspondingly to a column of the unit pixel cells, and transmits a voltage of the unit pixel cells of the corresponding column, and a vertical scanning unit which selects a row of the unit pixel cells having a voltage to be outputted to the vertical signal line, wherein the vertical signal line is located below the pixel electrode of the unit pixel cells corresponding to the vertical signal line.

16 Claims, 11 Drawing Sheets

(51) Int. Cl.
*G02F 1/13* (2006.01)
*H01L 27/146* (2006.01)
*G02F 1/1362* (2006.01)

(52) U.S. Cl.
CPC .... *H01L27/14643* (2013.01); *H01L 27/14665* (2013.01); *G02F 1/136286* (2013.01); *H01L 27/14638* (2013.01)

(56) References Cited

U.S. PATENT DOCUMENTS

| | | | | |
|---|---|---|---|---|
| 6,462,806 | B2* | 10/2002 | Zhang et al. | 349/199 |
| 6,469,740 | B1 | 10/2002 | Kuroda et al. | |
| 6,864,950 | B2* | 3/2005 | Zhang et al. | 349/199 |
| 7,042,548 | B2* | 5/2006 | Zhang et al. | 349/199 |
| 7,046,282 | B1* | 5/2006 | Zhang et al. | 348/294 |
| 7,214,921 | B2* | 5/2007 | Miyashita et al. | 250/208.1 |
| 7,235,814 | B2* | 6/2007 | Zhang et al. | 257/72 |
| 7,242,449 | B1* | 7/2007 | Yamazaki et al. | 349/116 |
| 7,265,811 | B2* | 9/2007 | Zhang et al. | 349/199 |
| 7,286,173 | B2* | 10/2007 | Zhang et al. | 348/294 |
| 7,442,572 | B2 | 10/2008 | Sohn | |
| 7,510,917 | B2* | 3/2009 | Zhang et al. | 438/154 |
| 7,525,615 | B2* | 4/2009 | Zhang et al. | 349/116 |
| 7,745,862 | B2 | 6/2010 | Sohn | |
| 7,859,621 | B2* | 12/2010 | Zhang et al. | 349/116 |
| 2001/0000676 | A1* | 5/2001 | Zhang et al. | 349/12 |
| 2003/0025136 | A1* | 2/2003 | Zhang et al. | 257/288 |
| 2003/0213915 | A1* | 11/2003 | Chao et al. | 250/370.14 |
| 2005/0202609 | A1* | 9/2005 | Zhang et al. | 438/164 |
| 2006/0145217 | A1 | 7/2006 | Sohn | |
| 2008/0006828 | A1* | 1/2008 | Zhang et al. | 257/72 |
| 2008/0224181 | A1 | 9/2008 | Uya | |
| 2008/0303071 | A1 | 12/2008 | Hong | |
| 2009/0039397 | A1* | 2/2009 | Chao | 257/233 |
| 2009/0072283 | A1 | 3/2009 | Sohn | |
| 2009/0224162 | A1 | 9/2009 | Inuiya et al. | |
| 2010/0007632 | A1* | 1/2010 | Yamazaki | 345/175 |

FOREIGN PATENT DOCUMENTS

| | | |
|---|---|---|
| JP | 10-281870 A | 10/1998 |
| JP | 11-121731 A | 4/1999 |
| JP | 2006-191007 A | 7/2006 |
| JP | 2008-227253 A | 9/2008 |
| JP | 2008-306155 A | 12/2008 |
| JP | 2009-212377 A | 9/2009 |

OTHER PUBLICATIONS

Japanese Office Action issued in Japanese Patent Application No. 2010-157289 mailed Apr. 1, 2014, 3 pgs.
Japanese Notice of Allowance issued in Japanese Patent Application No. 2010-157289 mailed Apr. 1, 2014, 3 pgs.
International Search Report issued in International Application No. PCT/JP2011/003948 dated Sep. 27, 2011.

* cited by examiner

SOLID-STATE IMAGING DEVICE

CROSS REFERENCE TO RELATED APPLICATIONS

This is a continuation application of PCT International Application No. PCT/JP2011/003948 filed on Jul. 8, 2011, designating the United States of America, which is based on and claims priority of Japanese Patent Application No. 2010-157289 filed on Jul. 9, 2010. The entire disclosures of the above-identified applications, including the specifications, drawings and claims are incorporated herein by reference in their entirety.

FIELD

The present invention relates to a solid-state imaging device, and particularly to a layered solid-state imaging device.

BACKGROUND

A typical solid-state imaging device uses a light receiving unit having an embedded photodiode structure.

Japanese Unexamined Patent Application Publication No. 55-120182 discloses a so-called layered solid-state imaging device, in which a photoelectric conversion layer is formed on a control electrode comprised by the solid-state imaging device, and a transparent electrode layer is disposed on the photoelectric conversion layer, and which converts optical information to an electric signal with a favorable SN ratio by applying the effect of a voltage applied to the transparent electrode layer to a control electrode via the photoelectric conversion layer.

CITATION LIST

Patent Literature

Japanese Unexamined Patent Application Publication No. 55-120182

SUMMARY

Technical Problem

A layered solid-state imaging device has a structure in which a photoelectric conversion film is formed above a semiconductor substrate including pixel circuits with an insulating film interposed between the photoelectric conversion film and the semiconductor substrate. Thus, a material with a high optical absorption coefficient such as an amorphous silicon can be used in the photoelectric conversion film. For example, in the case where an amorphous silicon is used, a green light with a wavelength of 550 nm is mostly absorbed by the photoelectric conversion film with a thickness of approximately 0.4 nm.

Because an embedded photodiode structure is not adopted, the capacitance of a photoelectric conversion unit can be increased, and thus saturation charge amount can be increased. In addition, because electric charges are not completely transferred, additional capacitance can be further increased, and a sufficiently high capacitance can be achieved also in a unit pixel cell with a finer structure. Furthermore, a structure like a stacked cell in a dynamic random access memory can be adopted.

However, a solid-state imaging device disclosed in Japanese Unexamined Patent Application Publication No. 55-120182 has a problem in that a signal mixing between unit pixel cells occurs due to electrical capacitive coupling. Specifically, when an output line (vertical signal line) for outputting a signal of the unit pixel cell of a column other than a predetermined column is disposed below the pixel electrode of the unit pixel cell of a predetermined column, signal mixing between different columns occurs, and causes image deterioration because of the capacitive coupling between the output line, and the photoelectric conversion film and the pixel electrode of a unit pixel cell of the predetermined column. This causes a reduction in space resolution which indicates spatial resolving power. In addition, a problem of color mixture is caused in an one-chip color area sensor which has a mosaic filter in an upper portion of the photoelectric conversion unit. The specification of color mixture usually allows approximately 3% of color mixture. In recent years, thanks to the improvement of digital signal processing technology, a high quality color image can be reproduced even with approximately 5% of color mixture. However, the color mixture is not caused by the capacitive coupling between unit pixel cells, and thus color mixture due to the capacitive coupling between unit pixel cells needs to be reduced to a level in a range of approximately 1 to 1.5%.

In the solid-state imaging device disclosed in Japanese Unexamined Patent Application Publication No. 55-120182, the upper photoelectric conversion film corresponding to a photodiode, a pixel electrode and a plug for contact which are connected to the photoelectric conversion film, and wiring exist, which provide a structure which easily causes electrical capacitive coupling between unit pixel cells. Thus, careful caution is necessary in design.

Thus, it is an object of the present invention to provide a layered solid-state imaging device which can reduce signal mixing between unit pixel cells due to electrical capacitive coupling.

Solution to Problem

In order to achieve the above-described object, a solid-state imaging device according to an aspect of the present invention includes a plurality of unit pixel cells arranged in a two-dimensional array, each of the pixel units cell including: a photoelectric conversion film which is formed above a semiconductor substrate and photoelectrically converts an incident light; a pixel electrode which is formed above the semiconductor substrate and is in contact with the photoelectric conversion film; an amplification transistor which is formed on the semiconductor substrate has a gate electrode connected to the pixel electrode, and outputs a signal voltage according to a potential of the pixel electrode; and a reset transistor which is formed on the semiconductor substrate, and resets a potential of the gate electrode of the amplification transistor, the solid-state imaging device further including: a vertical signal line which is provided correspondingly to a column of the unit pixel cells, and transmits a signal voltage of the unit pixel cells of the corresponding column; and a row selection unit configured to select a row of the unit pixel cells having a signal voltage to be outputted to the vertical signal line, wherein the vertical signal line is located below the pixel electrodes of the unit pixel cells corresponding to the vertical signal line.

According to this aspect, the vertical signal line of other unit pixel cell adjacent to a predetermined unit pixel cell in the row direction is not located below the pixel electrode of the predetermined unit pixel cell, and thus the capacitive coupling between the pixel electrode of a predetermined unit pixel cell, and vertical signal line of other unit pixel cell adjacent to the predetermined pixel unit can be reduced. Consequently, signal mixing between unit pixel cells due to electrical capacitive coupling can be reduced so as to improve spatial resolution, and color mixture in one-chip color area sensor can be reduced. Consequently, a layered solid-state imaging device with high resolution can be achieved.

The vertical signal line may include wiring in a wiring layer other than a wiring layer in an uppermost region of a multi-layered wiring layer provided between (i) the amplification transistor, the reset transistor, and (ii) the pixel electrode.

Specifically, the vertical signal line may include wiring in a lowermost region of the multi-layered wiring layer provided between (i) the amplification transistor, the reset transistor, and (ii) the pixel electrode.

According to this aspect, the distance between the pixel electrode of a predetermined unit pixel cell, and vertical signal line of other unit pixel cell adjacent to the predetermined pixel unit can be increased, and thus the capacitive coupling between the pixel electrode and the vertical signal line can be further reduced.

Each of the unit pixel cells may have local wiring which is located below the pixel electrode of the unit pixel cell and connects between the amplification transistor and the reset transistor of the unit pixel cell.

According to this aspect, local wiring of other unit pixel cell adjacent to a predetermined unit pixel cell is not located below the pixel electrode of the predetermined unit pixel cell, and thus the capacitive coupling between the pixel electrode of a predetermined unit pixel cell, and local wiring of other unit pixel cell adjacent to the predetermined pixel unit can be reduced.

The local wiring may include wiring in a wiring layer other than a wiring layer in the uppermost region of the multi-layered wiring layer provided between (i) the amplification transistor, the reset transistor, and (ii) the pixel electrode.

Specifically, the local wiring may include wiring in a wiring layer in the lowermost region of the multi-layered wiring layer provided between (i) the amplification transistor, the reset transistor, and (ii) the pixel electrode.

According to this aspect, the distance between the pixel electrode of a predetermined unit pixel cell, and local wiring of other unit pixel cell adjacent to the predetermined pixel unit can be increased, and thus the capacitive coupling between the pixel electrode and the local wiring can be further reduced.

A solid-state imaging device according to an aspect of the present invention includes a plurality of unit pixel cells arranged in a two-dimensional array, each of the pixel units cell including: a photoelectric conversion film which is formed above a semiconductor substrate and photoelectrically converts an incident light; a pixel electrode which is formed above the semiconductor substrate and is in contact with the photoelectric conversion film; an amplification transistor which is formed on the semiconductor substrate has a gate electrode connected to the pixel electrode, and outputs a signal voltage according to a potential of the pixel electrode; and a reset transistor which is formed on the semiconductor substrate, and resets a potential of the gate electrode of the amplification transistor, the solid-state imaging device further including: a vertical signal line which is provided correspondingly to a column of the unit pixel cells and transmits a signal voltage of the unit pixel cells of the corresponding column; and row selection unit configured to select a row of the unit pixel cell having a signal voltage to be outputted to the vertical signal line, wherein the vertical signal line is located below the pixel electrodes of the unit pixel cell adjacent to the unit pixel cells corresponding to the vertical signal line, and includes wiring in a wiring layer other than a wiring layer in an uppermost region of a multi-layered wiring layer provided between (i) the amplification transistor, the reset transistor, and (ii) the pixel electrode.

Specifically, the vertical signal line may include wiring in a lowermost region of the multi-layered wiring layer provided between (i) the amplification transistor, the reset transistor, and (ii) the pixel electrode.

According to this aspect, the distance between the pixel electrode of a predetermined unit pixel cell, and vertical signal line of other unit pixel cell adjacent to the predetermined pixel unit can be increased, and thus the capacitive coupling between the pixel electrode and the vertical signal line can be reduced. Consequently, a layered solid-state imaging device with high resolution can be achieved.

Because the layered solid-state imaging device has a layered structure, a small-sized solid-state imaging device can be achieved.

A solid-state imaging device according to an aspect of the present invention includes a plurality of unit pixel cells arranged in a two-dimensional array, each of the pixel units cell including: a photoelectric conversion film which is formed above a semiconductor substrate and photoelectrically converts an incident light; a pixel electrode which is formed above the semiconductor substrate and is in contact with the photoelectric conversion film; an amplification transistor which is formed on the semiconductor substrate has a gate electrode connected to the pixel electrode, and outputs a signal voltage according to a potential of the pixel electrode; and a reset transistor which is formed on the semiconductor substrate, and resets a potential of the gate electrode of the amplification transistor, the solid-state imaging device further including: a vertical signal line which is provided correspondingly to a column of the unit pixel cells and transmits a signal voltage of the unit pixel cells of the corresponding column; and a row selection unit configured to select a row of the unit pixel cell having a signal voltage to be outputted to the vertical signal line, wherein the vertical signal line is located below the pixel electrode of the unit pixel cell adjacent to the unit pixel cell corresponding to the vertical signal line, and a shielding electrode which reduces capacitive coupling between the pixel electrode and the vertical signal line located below the pixel electrode is provided therebetween.

According to this aspect, there is disposed an electrical shield between the pixel electrode of a predetermined unit pixel cell, and vertical signal line of other unit pixel cell adjacent to the predetermined unit pixel cell, and thus the capacitive coupling between the pixel electrode and the vertical signal line can be reduced. Consequently, a solid-state imaging device with high resolution can be achieved.

The shielding electrode may be wiring in the amplification transistor or the reset transistor.

According to this aspect, the capacitive coupling between the pixel electrode of a predetermined unit pixel cell, and the vertical signal line of other unit pixel cell adjacent to the predetermined pixel unit can be reduced without increasing the number of wiring patterns.

A solid-state imaging device according to an aspect of the present invention includes a plurality of unit pixel cells arranged in a two-dimensional array, each of the pixel units cell including: a photoelectric conversion film which is formed above a semiconductor substrate and photoelectrically converts an incident light; a pixel electrode which is formed above the semiconductor substrate and is in contact with the photoelectric conversion film; an amplification transistor which is formed on the semiconductor substrate has a gate electrode connected to the pixel electrode, and outputs a signal voltage according to a potential of the pixel electrode; a reset transistor which is formed on the semiconductor substrate, and resets a potential of the gate electrode of the amplification transistor; and wiring which electrically connects the amplification transistor, the reset transistor, and the selection transistor, the solid-state imaging device further including: a vertical signal line which is provided correspondingly to a column of the unit pixel cells and transmits a signal voltage of the unit pixel cells of the corresponding column; and a row selection unit configured to select a row of the unit pixel cell having a signal voltage to be outputted to the vertical signal line, wherein a thickness of the pixel electrode is less than a thickness of the wiring.

Specifically, an insulating layer may be disposed between the pixel electrode and the wiring, so that the pixel electrode satisfies the following relationship: $s < p \times W/T$ where W is a width of wiring, T is a film pressure of the insulating layer, s is the thickness of the pixel electrode, and p is a distance between the pixel electrodes of the unit pixel cells adjacent to each other.

According to this aspect, the thickness of the pixel electrode becomes thinner, and thus the capacitive coupling between the pixel electrode of a predetermined unit pixel cell, and other unit pixel cell adjacent to the predetermined pixel unit can be reduced. Consequently, a layered solid-state imaging device with high resolution can be achieved.

A solid-state imaging device according to an aspect of the present invention includes a plurality of unit pixel cells arranged in a two-dimensional array, each of the pixel units cell including: a photoelectric conversion film which is formed above a semiconductor substrate and photoelectrically converts an incident light; a pixel electrode which is formed above the semiconductor substrate and is in contact with the photoelectric conversion film; an amplification transistor which is formed on the semiconductor substrate has a gate electrode connected to the pixel electrode, and outputs a signal voltage according to a potential of the pixel electrode; and a reset transistor which is formed on the semiconductor substrate, and resets a potential of the gate electrode of the amplification transistor, the solid-state imaging device further including: a vertical signal line which is provided correspondingly to a column of the unit pixel cells and transmits a signal voltage of the unit pixel cells of the corresponding column; and a row selection unit configured to select a row of the unit pixel cell having a signal voltage to be outputted to the vertical signal line, wherein the unit pixel cell is located below the pixel electrode of the unit pixel cell adjacent to the unit pixel cell, and has local wiring which connects between the amplification transistor and the reset transistor of the unit pixel cell, and the local wiring includes wiring in a wiring layer other than a wiring layer in an uppermost region of a multi-layered wiring layer provided between the amplification, reset transistors, and the pixel electrode.

Specifically, the local wiring may include wiring in a wiring layer in the lowermost region of the multi-layered wiring layer provided between (i) the amplification transistor, the reset transistor, and (ii) the pixel electrode.

According to this aspect, the distance between the pixel electrode of a predetermined unit pixel cell, and local wiring of other unit pixel cell adjacent to the predetermined pixel unit can be increased, and thus the capacitive coupling between the pixel electrode and the local wiring can be reduced. Consequently, a layered solid-state imaging device with high resolution can be achieved.

A shielding electrode which reduces capacitive coupling between the pixel electrode and the local wiring located below the pixel electrode may be provided therebetween.

According to this aspect, there is disposed an electrical shield between the pixel electrode of a predetermined unit pixel cell, and local wiring of other unit pixel cell adjacent to the predetermined unit pixel cell, and thus the capacitive coupling between the pixel electrode and the local wiring can be further reduced.

The shielding electrode may be wiring in the amplification transistor, the reset transistor, or the selection transistor.

According to this aspect, the capacitive coupling between the pixel electrode of a predetermined unit pixel cell, and local wiring of other unit pixel cell adjacent to the predetermined unit pixel cell can be reduced without increasing the number of wiring patterns.

Advantageous Effects

According to one aspect of the present invention, the capacitive coupling between unit pixel cells can be reduced so as to improve spatial resolution, and color mixture in one-chip color area sensor can be reduced. Consequently, a layered solid-state imaging device with high resolution, i.e., a compact solid-state imaging device having an excellent color reproducibility can be achieved.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiment 1

Hereinafter, a solid-state imaging device according to Embodiment 1 of the present invention will be described with reference to the accompanying drawings.

Figure 1:
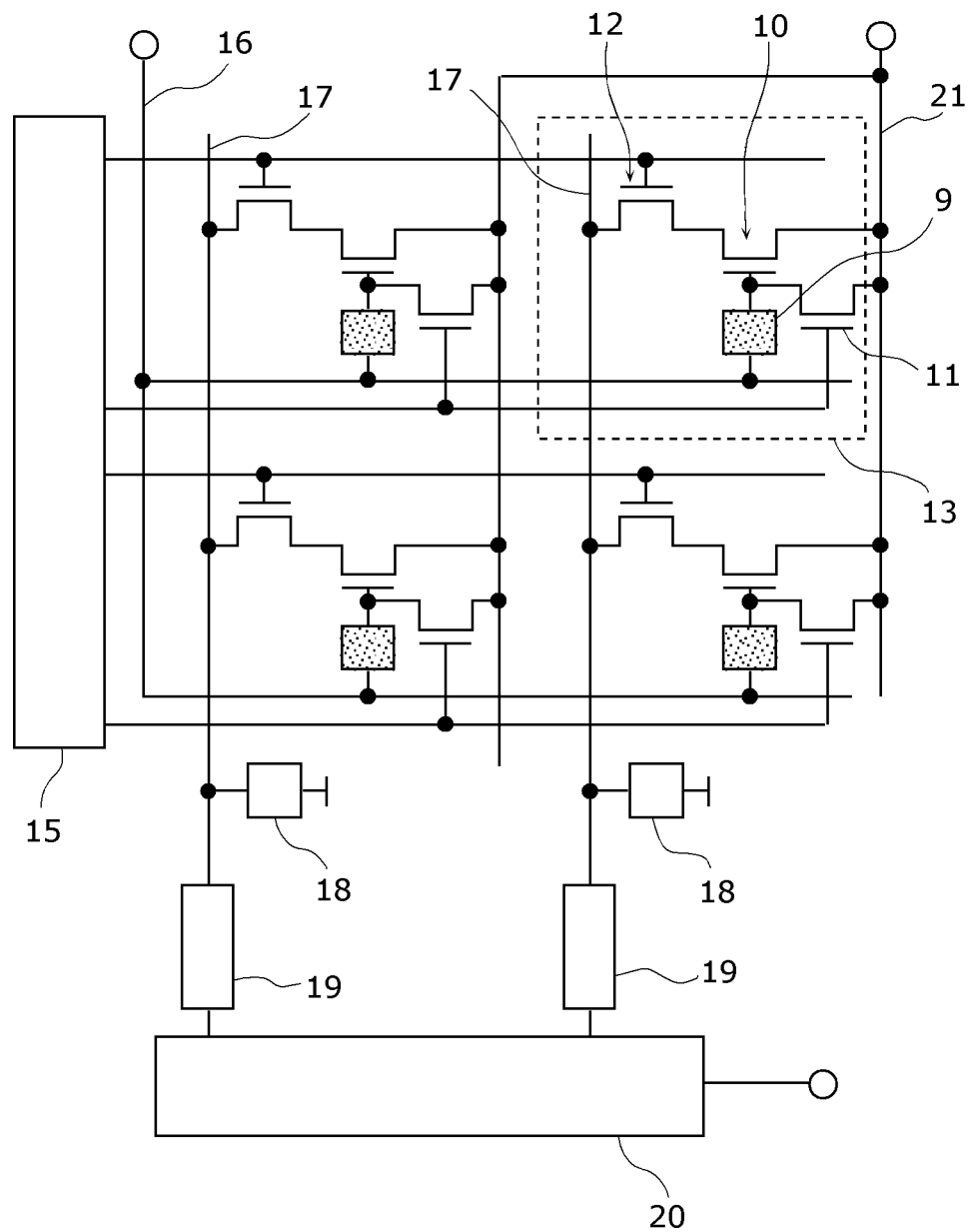
FIG. 1 is a plan view illustrating a schematic configuration of a solid-state imaging device according to Embodiment 1 of the present invention.

FIG. 1 is a plan view illustrating a schematic configuration of a solid-state imaging device according to the present embodiment.

As illustrated in FIG. 1, the above solid-state imaging device is a layered solid-state imaging device which includes a plurality of unit pixel cells 13 arranged in two-dimensional form, a vertical scanning unit (row selection unit) 15, a photoelectric conversion film control line 16, a vertical signal line (vertical signal line wiring) 17, a loading unit 18, a column signal processing unit 19, and a horizontal signal reading unit 20.

The unit pixel cell 13 has a photoelectric conversion film 9, an amplification transistor 10, a reset transistor 11, and an address transistor (line selection transistor) 12.

The photoelectric conversion film 9 performs photoelectric conversion on incident light, and generates and accumulates a signal charge according to the quantity of the incident light. The amplification transistor 10 outputs a signal voltage according to the quantity of the signal charge generated by the photoelectric conversion film 9. The reset transistor 11 resets (initializes) the voltage of the photoelectric conversion film 9, i.e., the gate voltage of the amplification transistor 10. The address transistor 12 causes the vertical signal line 17 to selectively output the signal voltage of a unit pixel cell 13 in a predetermined row.

The vertical scanning unit 15 scans the row of the unit pixel cell 13 in the vertical direction, and selects the row of the unit pixel cell 13 having a signal voltage to be outputted by the vertical signal line 17.

The photoelectric conversion film control line 16 is commonly connected to a plurality of unit pixel cells 13, and applies the same voltage to a plurality of photoelectric conversion films 9.

A plurality of vertical signal lines 17 are arranged in the row direction, and are connected to the unit pixel cell 13, i.e., the source of the address transistor 12. The vertical signal line 17 is provided correspondingly to each column of the unit pixel cell 13, and transmits the signal voltage outputted from the unit pixel cell 13 in the corresponding column in the vertical direction (column direction).

The loading unit 18 is provided correspondingly to each vertical signal line 17, and is connected to the corresponding vertical signal line 17.

The column signal processing unit 19 performs noise reduction signal processing represented by correlated double sampling and A/D conversion (analog to digital conversion). The column signal processing unit 19 is provided correspondingly to each vertical signal line 17, and is connected to the corresponding vertical signal line 17.

The horizontal signal reading unit 20 sequentially reads signals of a plurality of horizontally-arranged column signal processing units 19 via horizontal common signal lines.

Power source wiring 21 is connected to the amplification transistor 10 and the drain of the reset transistor 11, and is wired on the arrangement region (imaging region) of the unit pixel cell 13 in the up-and-down direction on the paper (the vertical direction). This is because the unit pixel cell 13 is addressed for every column, and thus if drain wiring is formed in the column direction (vertical direction), all the pixel drive current in one column flows through a single line of wiring, and thus a large voltage drop occurs.

Figure 2:
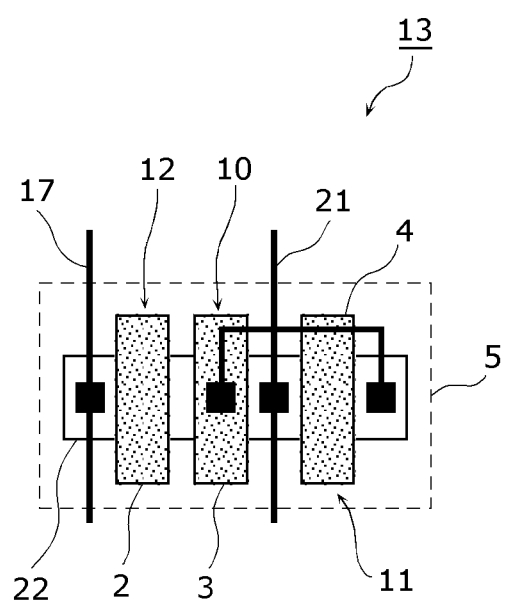
FIG. 2 is a plan view illustrating a detailed configuration of a unit pixel cell of the solid-state imaging device according to Embodiment 1 of the present invention.

FIG. 2 is a plan view illustrating a detailed configuration of a unit pixel cell 13.

In the unit pixel cell 13, the inside of a first active region 22 formed on a semiconductor substrate includes active regions of an amplification transistor 10, a reset transistor 11, and an address transistor 12. The active region indicates a source diffusion layer region, a drain diffusion layer region, and a gate region (channel regions). On the first active region 22, there are provided a gate electrode 2 of the address transistor 12, a gate electrode 3 of the amplification transistor 10, and a gate electrode 4 of the reset transistor 11. The gate electrodes 2, 3, and 4 are composed of a polysilicon or the like, and are connected to wiring (thick line segments in FIG. 2) composed of Al (aluminum), Cu (copper) or the like via contact holes (black squares in FIG. 2).

The vertical signal line 17 is connected to the source of the address transistor 12, and the drains of the amplification transistor 10 and the reset transistor 11 form a common region, which is connected to the power source wiring 21.

The source of the reset transistor 11 and the gate of the amplification transistor 10 are commonly pulled over the semiconductor substrate and are connected to a pixel electrode 5. Unlike a layered sensor (layered solid-state imaging device), in an embedded sensor (embedding solid-state imaging device) having a photodiode in a semiconductor substrate, the above connection is made to a photodiode rather than a pixel electrode. Because the photodiode is designed to have a large area as much as possible in order to efficiently use incident light, the layered sensor and the embedded sensor have completely different layout of unit pixel cells. The layered sensor does not need to have a large photodiode area, and thus is designed in a specific manner. Because of this reason, reduced area of circuit sections in a layered sensor produces a significant effect on the finer structure in contrast to an embedded sensor with a photodiode. This is because it is desired that the area of a photodiode should be at least half of the area of the unit pixel cell in an embedded sensor. In the case of a layered sensor, the area of a photoelectric conversion unit is approximately equal to the area of a unit pixel cell, and thus the effect on the finer structure is enormous.

Figure 3:
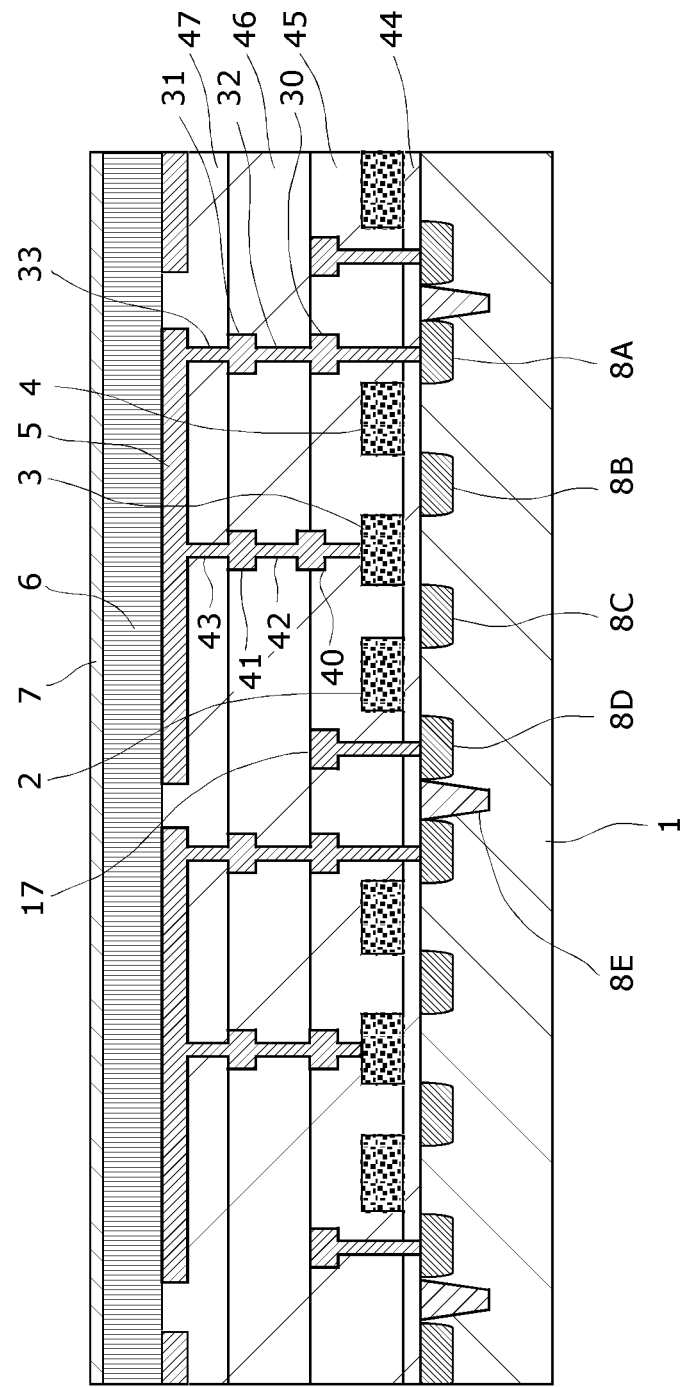
FIG. 3 is a cross-sectional view illustrating a detailed configuration of a unit pixel cell of the solid-state imaging device according to Embodiment 1 of the present invention.

FIG. 3 is a cross-sectional view illustrating a detailed structure of the unit pixel cell 13.

In the unit pixel cell 13, as illustrated in FIG. 3, the reset transistor 11 includes n-type diffusion layer regions 8A, 8B formed in a p-type silicon substrate 1 as a semiconductor substrate, and a gate electrode 4 formed on the silicon substrate 1 with a gate insulating film 44 interposed therebetween. Similarly, the amplification transistor 10 includes n-type diffusion layer regions 8B, 8C formed in the p-type silicon substrate 1, and a gate electrode 3 formed on the p-type silicon substrate 1. In addition, the address transistor 12 includes n-type diffusion layer regions 8C, 8D formed in the p-type silicon substrate 1, and a gate electrode 2 formed on the p-type silicon substrate 1.

An element isolation region 8E is formed between adjacent unit pixel cells 13.

The n-type diffusion layer region 8A serves as the source of the reset-transistor 11, and the n-type diffusion layer region 8B serves as the drain of the reset transistor 11 and the amplification transistor 10. The n-type diffusion layer region 8C serves as the source of the amplification transistor 10, and as the drain of the address transistor 12, and the n-type diffusion layer region 8D serves as the source of the address transistor 12.

An interlayer insulating film, a pixel electrode 5, a photoelectric conversion film 6, and a transparent electrode 7 are successively layered over the pixel circuit comprising those three transistors, i.e., the address transistor 12, the amplification transistor 10, and the reset transistor 11.

The photoelectric conversion film 6 composed of an amorphous silicon or the like, the pixel electrode 5, the transparent electrode 7 formed on the upper surface of the photoelectric conversion film 6, and the n-type diffusion layer region 8A constitute the photoelectric conversion film 9. The pixel electrode 5 is connected via a contact to the gate electrode 3 of the amplification transistor 10, and the n-type diffusion layer region 8A which serves as the source of the reset transistor 11. The n-type diffusion layer region 8A connected to the pixel electrode 5 also serves as an accumulation diode.

The photoelectric conversion film 6 is formed on the p-type silicon substrate 1, and photoelectrically converts incident light. The pixel electrode 5 is formed on the p-type silicon substrate 1 (on the surface of the photoelectric conversion film 6, which faces the silicon substrate 1) to be contact with the photoelectric conversion film 6 so as to collect signal charges which are generated in the photoelectric conversion film 6. The transparent electrode 7 is formed on the p-type silicon substrate 1 (on the surface the photoelectric conversion film 6, which is opposed to the silicon substrate 1) and applies a constant voltage to the photoelectric conversion film 6, so that the pixel electrode 5 reads the signal charges of the photoelectric conversion film 6. The amplification transistor 10 is a transistor which is formed under the pixel electrode 5 in the p-type silicon substrate 1, and has the gate electrode 3 connected to the pixel electrode 5 so as to output a signal voltage according to the potential of the pixel electrode 5. The reset transistor 11 is a transistor which is formed under the pixel electrode 5 in the p-type silicon substrate 1, and resets the potential of the gate electrode 3 of the amplification transistor 10. The address transistor 12 is a transistor which is formed under the pixel electrode 5 in the p-type silicon substrate 1, provided between the amplification transistor 10 and the vertical signal line 17, and outputs a signal voltage from the unit pixel cell 13 to the vertical signal line 17.

The vertical signal line 17 is located below the pixel electrode 5 of a predetermined unit pixel cell 13 corresponding to the vertical signal line 17, and is not located below the unit pixel cell 13 which is adjacent to the predetermined unit pixel cell 13 in the row direction. The vertical signal line 17 includes wiring in a wiring layer other than a wiring layer in the uppermost region of the multi-layered wiring layer provided between the amplification transistor 10, the reset transistor 11, and the pixel electrode 5. Specifically, the vertical signal line 17 includes wiring in the lowermost region of the multi-layered wiring layer provided between the amplification transistor 10, the reset transistor 11, and the pixel electrode 5.

In the above, the conductivity type of the silicon substrate 1 is p-type, and each transistor is n-channel type, however, the conductivity type of the silicon substrate 1 may be n-type, and each transistor may be n-channel type. In this case, the symbols for voltage potential are reversed.

A first wiring layer 40 and a second wiring layer 41 that are connected to the gate electrode 3 of the amplification transistor 10 are layered up to be connected to the pixel electrode 5 via a first via contact 42 and a second via contact 43. The first wiring layer 30 and a second wiring layer 31 that are connected to the n-type diffusion layer region 8A are layered up to be connected to the pixel electrode 5 via a first via contact 32 and a second via contact 33. The first wiring layer 30 and the second wiring layer 31 which are connected to the source of the reset transistor 11 as the first via contact 42 and the second via contact 43 are layered up, come contact with the pixel electrode 5 via the first via contact 32 and the second via contact 33. The gate electrode, each wiring layer, and the pixel electrode are respectively provided with interlayer insulating films 45, 46, and 47.

In a space above the vertical signal line 17 connected to the source of the address transistor 12, i.e., the n-type diffusion layer region 8D, the pixel electrode 5 of the unit pixel cell 13 provided correspondingly to the vertical signal line 17 is disposed to project downward, but the pixel electrode 5 of other unit pixel cell 13 which is adjacent in the row direction to the unit pixel cell 13 provided correspondingly to the vertical signal line 17 does not exist in the space.

The second via contact 33 is connected to the endmost portion of the pixel electrode 5, where the second via contact 33 provides upper connection for the wiring layers connected to the n-type diffusion layer region 8A as an the accumulation diode. In the case where the pixel electrode 5 is arranged such that the second via contact 33 provided for the accumulation diode, or the second via contact 43 provided for the gate electrode 3 of the amplification transistor 10 is disposed near the center of the pixel electrode 5, the resulting structure is not the structure as illustrated in FIG. 3, and the pixel electrode 5 is shifted in the right direction in FIG. 3, and appears over the vertical signal line 17 of the adjacent unit pixel cell 13. Thus, the pixel electrode 5 and the vertical signal line 17 overlap with each other when viewed from the top. Even in the layout without this overlap in FIG. 3, the vertical signal line 17 has a capacitive coupling with the pixel electrode 5 of the adjacent unit pixel cell 13 in an oblique direction. Therefore, the vertical signal line 17 is preferably wired at a position as low as possible.

The degree of color mixture of the unit pixel cell 13 in a layered sensor is determined by a ratio of the capacitance between the vertical signal line 17 and the pixel electrode 5 with respect to all the capacitances of the portions electrically connected to the pixel electrode 5. The degree is preferably in a range of 1 to 1.5%. The capacitance of the portion electrically connected to the pixel electrode 5 is primarily the sum of the capacitance of the photoelectric conversion film 6, the pn-junction capacitance of the accumulation diode, and the gate capacitance of the amplification transistor 10. Generally, the capacitive value is proportional to the cell area. On the other hand, the capacitance between the vertical signal line 17 and the pixel electrode 5 is proportional to the length of a side of the cell. Therefore, the color mixture due to the capacitance ratio increases as a finer structure of the cell is sought. As an example, if the vertical signal line 17 is located below the pixel electrode 5 of the adjacent unit pixel cell 13, the capacitance of the photoelectric conversion film with 1 micron (μm) cell is ⅑ of the capacitance of the photoelectric conversion film 6 having a 3 μm cell, while the capacitance between the vertical signal lines 17 and the pixel electrode 5 is only ⅓ thereof, and thus degree of color mixture is increased by 3 times.

As described above, with the solid-state imaging device according to Embodiment 1 of the present invention, the capacitive coupling between the pixel electrode 5 of a predetermined unit pixel cell 13, and the signal output line of other unit pixel cell 13 adjacent to the predetermined unit pixel cell 13 in the row direction can be reduced. In addition, the capacitance between adjacent electrodes 5 can be reduced.

Embodiment 2

Hereinafter, a solid-state imaging device according to a second embodiment of the present invention will be described with reference to the accompanying drawings. The features of Embodiment 2 which differ from those of Embodiment 1 will be mainly described below.

Figure 4:
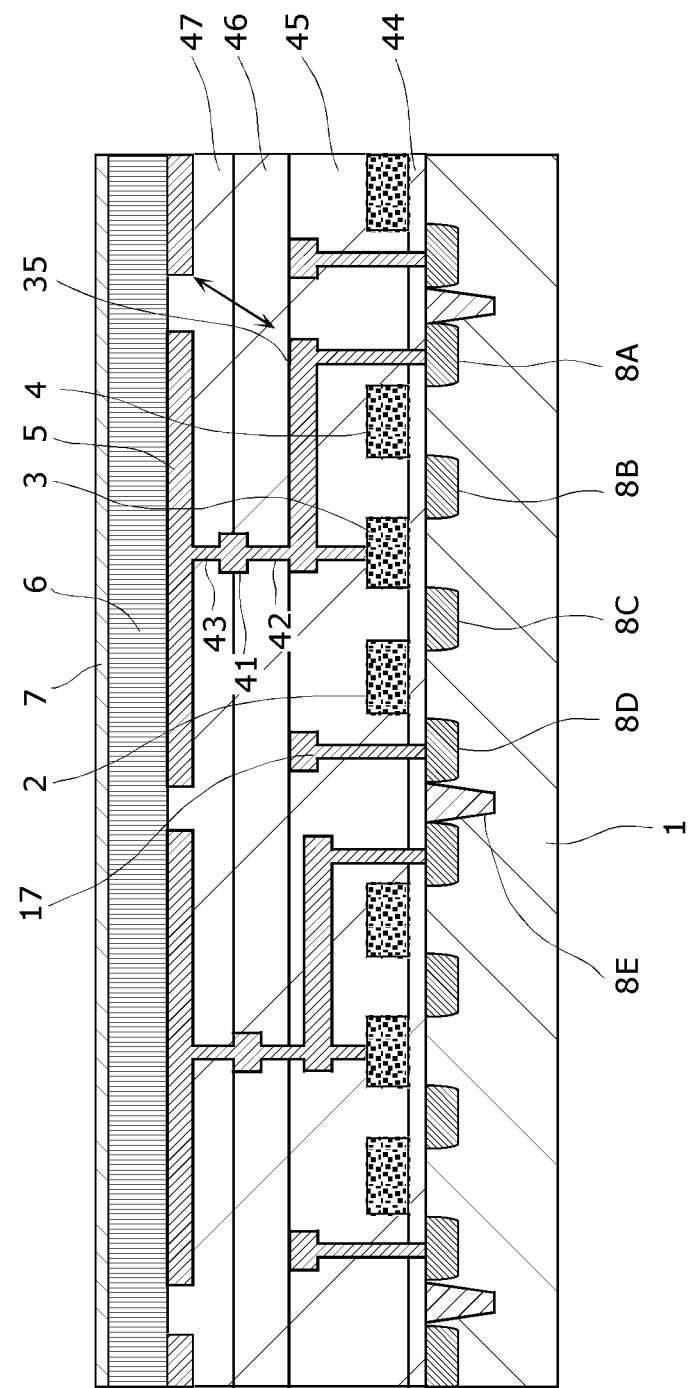
FIG. 4 is a cross-sectional view illustrating a detailed configuration of a unit pixel cell of a solid-state imaging device according to Embodiment 2 of the present invention.

FIG. 4 is a cross-sectional view illustrating a detailed structure of a unit pixel cell 13 of a solid-state imaging device according to the present embodiment.

The above solid-state imaging device differs from the solid-state imaging device according to Embodiment 1 in that the unit pixel cell 13 is located below the pixel electrode 5 of the unit pixel cell 13, and has a pixel local wiring 35 which connects between the amplification transistor 10 of the unit pixel cell 13, and the reset transistor 11 (accumulation diode). The pixel local wiring 35 includes wiring in a wiring layer other than a wiring layer in the uppermost region of the multi-layered wiring layer provided between the amplification transistor 10, the reset transistor 11, and the pixel electrode 5. Specifically, the pixel local wiring 35 includes wiring in the lowermost region of the multi-layered wiring layer provided between the amplification transistor 10, the reset transistor 11, and the pixel electrode 5.

In the solid-state imaging device of FIG. 3, even when a finer structure of the unit pixel cell 13 is achieved, the second via contact 33 connected to the accumulation diode may be located off the pixel electrode 5. The biggest reason for this is that a layered sensor has a specific layout that is not adopted in the design of a conventional embedded sensor in which a photodiode is in the semiconductor substrate. The layout is such that wiring layers are individually necessary for a via contact which electrically connects the amplification transistor 10 and the pixel electrode 5, and other via contact which electrically connects the accumulation diode and the pixel electrode 5. In order to electrically connect transistors below the wiring layer to the pixel electrode 5 above the wiring layer, the intermediate wiring layer needs a sufficient width for two pieces of wiring.

Even when the pixel local wiring 35 is used as in FIG. 4, a width for at least one piece of wiring is necessary. That is to say, in order to electronically transmit a signal of the pixel electrode 5 to a lower transistor, other pieces of wiring must be arranged not to interfere with the wiring for the signal transmission in all wiring layers. For this reason, two-dimensional bypass wiring is often used, and wiring needs to be made below the pixel electrode 5 of the adjacent unit pixel cell 13 in some cases. This problem is made even more difficult due to the fact that a finer structure of a semiconductor in recent years is limited by the wiring, and not by the size of the semiconductor. However, at least one piece of wiring in the unit pixel cell 13 can be omitted by using the pixel local wiring 35, and thus a finer structure of the unit pixel cell 13 can be achieved.

As illustrated in FIG. 4, the contact between the gate of the amplification transistor 10 and the pixel electrode 5 is secured by the pixel local wiring 35. The pixel local wiring 35 is preferably made with wiring in the lowermost region so as to have a reduced capacitive coupling by increasing the distance between the pixel local wiring 35 of a predetermined unit pixel cell 13, and the pixel electrode 5 of other unit pixel cell 13 adjacent to the predetermined unit pixel cell 13. The pixel local wiring 35 is preferably not made with wiring in the uppermost region even if not being made with wiring in the lowermost region.

As described above, with the solid-state imaging device according to Embodiment 2 of the present invention, the capacitive coupling between the pixel electrode 5 of a predetermined unit pixel cell 13, and the pixel local wiring 35 of other unit pixel cell 13 adjacent to the predetermined unit pixel cell 13 in the row direction can be reduced. Thus a finer structure of the unit pixel cell 13 can be achieved.

Embodiment 3

Hereinafter, a solid-state imaging device according to a third embodiment of the present invention will be described with reference to the accompanying drawings. The features of Embodiment 3 which differ from those of Embodiment 1 will be mainly described below.

Figure 5:
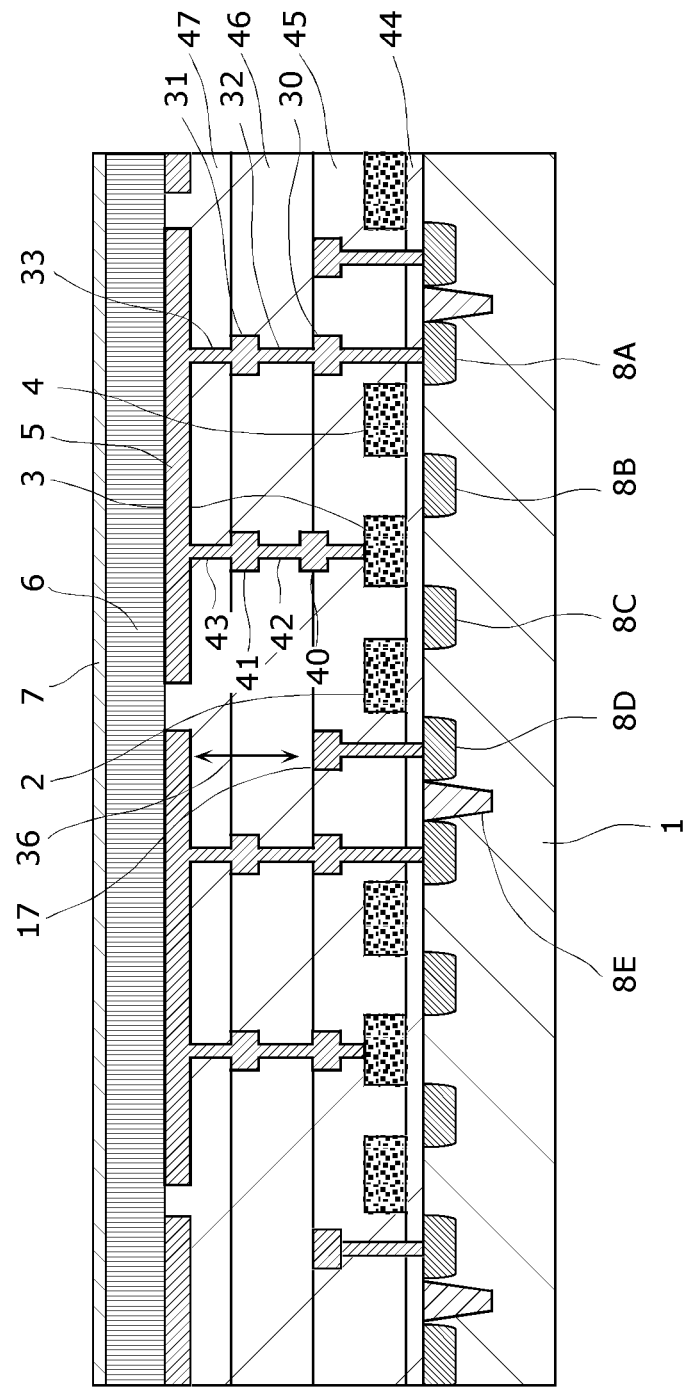
FIG. 5 is a cross-sectional view illustrating a detailed configuration of a unit pixel cell of a solid-state imaging device according to Embodiment 3 of the present invention.

FIG. 5 is a cross-sectional view illustrating a detailed configuration of a unit pixel cell 13 of a solid-state imaging device according to the present embodiment.

The above solid-state imaging device differs from the solid-state imaging device according to Embodiment 1 in that the vertical signal line 17 is located below the pixel electrode 5 of other unit pixel cell 13 adjacent of the unit pixel cell 13 corresponding to the vertical signal line 17.

As a finer structure of the unit pixel cell 13 is sought, there is an increasing possibility that the vertical signal line 17 corresponding to other unit pixel cell 13 adjacent to a predetermined unit pixel cell 13 is inevitably disposed below the pixel electrode 5 of the predetermined unit pixel cell 13 as illustrated in FIG. 5. Thus, in order to reduce the capacitive coupling between the vertical signal line 17 and the pixel electrode 5, the vertical signal line 17 includes wiring in the lowermost region. This is for the purpose of increasing the distance between the pixel electrode 5 and the vertical signal line 17.

As a finer structure of the unit pixel cell 13 is sought, the pixel electrode 5 of a predetermined unit pixel cell 13, and the vertical signal line 17 corresponding to other unit pixel cell 13 adjacent to the predetermined unit pixel cell 13 overlap with each other when the solid-state imaging device is viewed from above. However, even in the case where such a overlap does not exist, a capacitive coupling between the pixel electrode 5 and the vertical signal line 17 still exists. Therefore, even in the case where there is no overlap, it is effective to form the vertical signal line 17 with wiring in the lowermost region. It is effective not to use wiring in the uppermost region, even if wiring in the lowermost region is not used.

As described above, with the solid-state imaging device according to Embodiment 3 of the present invention, the vertical signal line 17 includes wiring in the lowermost region, and thus the capacitive coupling between the pixel electrode 5 of a predetermined unit pixel cell 13, and the signal output line of other unit pixel cell 13 adjacent to the predetermined unit pixel cell 13 in the row direction can be reduced.

Embodiment 4

Hereinafter, a solid-state imaging device according to a fourth embodiment of the present invention will be described with reference to the accompanying drawings. The features of Embodiment 4 which differ from those of Embodiment 3 will be mainly described below.

Figure 6:
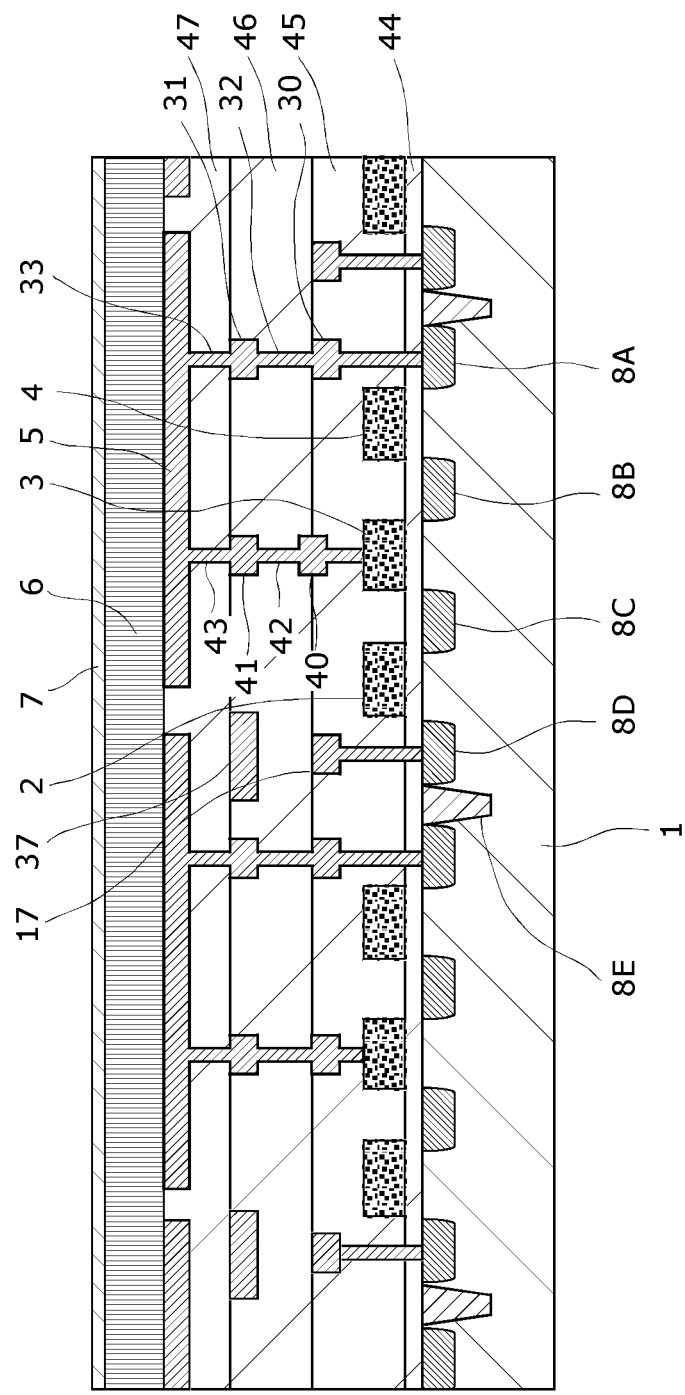
FIG. 6 is a cross-sectional view illustrating a detailed configuration of a unit pixel cell of a solid-state imaging device according to Embodiment 4 of the present invention.

FIG. 6 is a cross-sectional view illustrating a detailed configuration of a unit pixel cell 13 of a solid-state imaging device according to the present embodiment.

The above solid-state imaging device differs from the solid-state imaging device according to Embodiment 3 in that a shielding electrode 37 for reducing a capacitive coupling is provided between the pixel electrode 5 and the vertical signal lines 17 located below the pixel electrode 5.

As illustrated in FIG. 6, when the solid-state imaging device is viewed from the side of the pixel electrode 5 (when the solid-state imaging device is viewed from above), even when the pixel electrode 5 of a predetermined unit pixel cell 13, and the vertical signal line 17 corresponding to other unit pixel cell 13 adjacent to the predetermined unit pixel cell 13 overlap with each other, the capacitive coupling between the pixel electrode 5 and the vertical signal line 17 can be reduced by interposing a shielding electrode 37 therebetween.

Because the purpose of disposing the shielding electrode 37 is to reduce the capacitive coupling, the vertical signal line 17 does not need to be completely shielded from the pixel electrode 5 two-dimensionally by the shielding electrode 37. Thus, instead of the shielding electrode 37, another wiring of the solid-state imaging device may be used as the shielding electrode 37. For example, the wiring of the gate electrode 4 of the reset transistor 11, the power source wiring of the reset transistor 11 and the amplification transistor 10, and/or the wiring of the gate electrode 2 of the address transistor 12 may be used as the shielding electrode 37.

As described above, with the solid-state imaging device according to Embodiment 4 of the present invention, the capacitive coupling between the pixel electrode 5 of a predetermined unit pixel cell 13, and the signal output line of other unit pixel cell 13 adjacent to the predetermined unit pixel cell 13 in the row direction can be reduced.

Embodiment 5

Hereinafter, a solid-state imaging device according to a fifth embodiment of the present invention will be described with reference to the accompanying drawings. The features of Embodiment 5 which differ from those of Embodiment 2 will be mainly described below.

Figure 7:
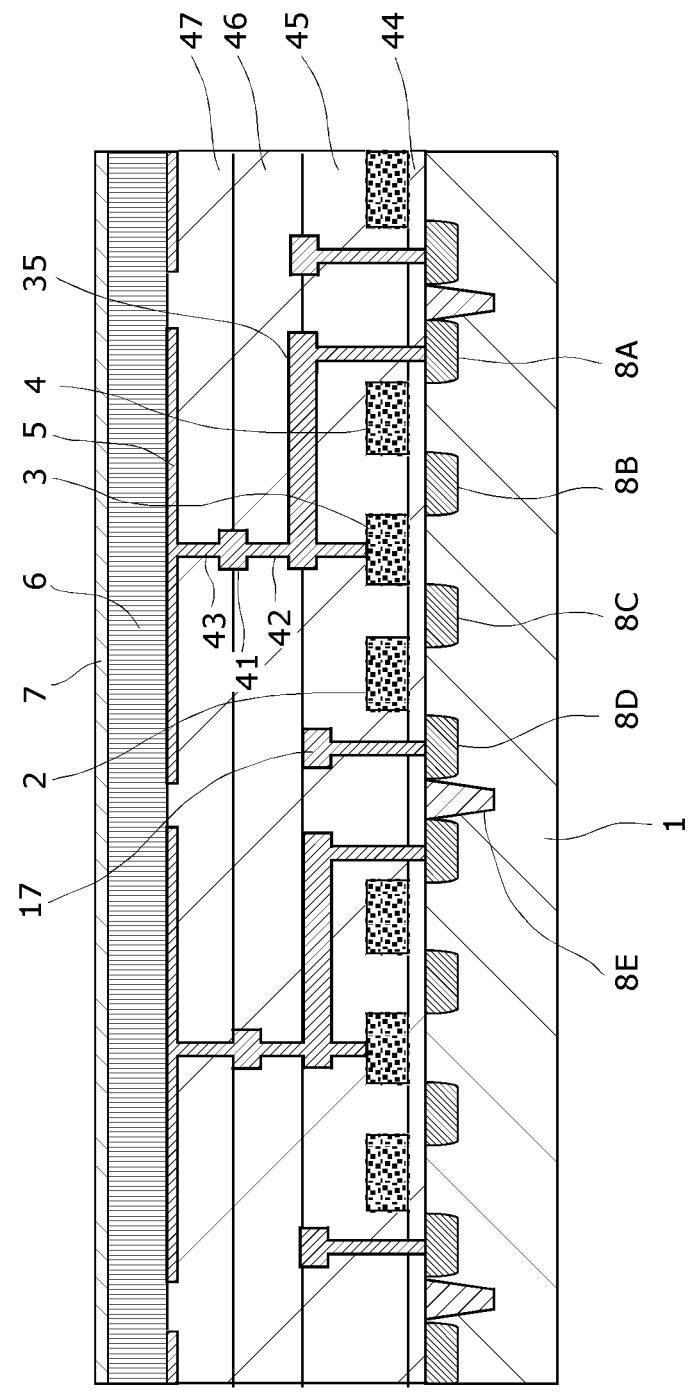
FIG. 7 is a cross-sectional view illustrating a detailed configuration of a unit pixel cell of a solid-state imaging device according to Embodiment 5 of the present invention.

FIG. 7 is a cross-sectional view illustrating a detailed configuration of a unit pixel cell 13 of a solid-state imaging device according to the present embodiment.

The above solid-state imaging device differs from the solid-state imaging device according to Embodiment 2 in that the unit pixel cell 13 has wiring which electrically connects the amplification transistor 10, the reset transistor 11, and the address transistor 12, and the thickness of the pixel electrode 5 of the unit pixel cell 13 is less than the thickness of wiring electrically connected to other pixel electrode 5 of the adjacent unit pixel cell 13. In the above, an insulating layer is disposed between the pixel electrode 5 and the wiring, and the pixel electrode 5 satisfies $s < p \times W/T$ where W is the width of wiring, T is the film pressure of the insulating layer, s is the thickness of the pixel electrode 5, and p is the distance between pixel electrodes 5 of adjacent unit pixel cells 13.

In Embodiments 1 to 4, the capacitive coupling due to an overlap between the pixel electrode 5 of a predetermined unit pixel cell 13, and the vertical signal line 17 of other unit pixel cell 13 adjacent to the predetermined unit pixel cell 13 in the row direction has been discussed. However, the electrical capacitance between adjacent pixel electrodes 5 is also a factor of color mixture, and thus a solution to this problem will be described below. The capacitive coupling between adjacent pixel electrodes 5, and the capacitive coupling between the pixel electrode 5 and wiring electrically connected to the adjacent pixel electrode 5 are factors to be considered. Similarly to the above-described capacitance ratio between the vertical signal line 17 and the pixel electrode 5, as a finer structure of the unit pixel cell 13 is sought, the degree of color mixture, i.e., the ratio of the capacitance between adjacent pixel electrodes 5 with respect to all the capacitances of the pixel electrode 5 increases. As described above, this is because the ratio of the side length of the cell to the area of the cell increases as a finer structure of the cell is sought.

First, the capacitive coupling between adjacent pixel electrodes 5 is discussed.

The capacitive coupling between the pixel electrode 5 and the wiring below the pixel electrode 5 is proportional to the width W of the wiring, and is inversely proportional to the film pressure T of the insulating layer between the pixel electrode 5 and the wiring below the pixel electrode 5. The value of the capacitance between adjacent pixel electrodes 5 is proportional to the thickness s of the pixel electrode 5, and is inversely proportional to the gap distance p between the adjacent pixel electrodes 5. Therefore, the thickness s of the pixel electrode 5 is preferably set such that $s < p \times W/T$ in order to make the value of the capacitance between adjacent pixel electrodes 5 less than the value of the capacitance between the pixel electrode 5 and the wiring below the pixel electrode 5. Generally, the capacitive coupling between wiring and the pixel electrode 5 is inevitable. Reducing the capacitance between adjacent pixel electrodes 5 rather than the capacitance between wiring and the pixel electrode 5 substantially prevents deterioration of resolution due to a capacitive coupling. As a rule of thumb, the width W of wiring should be the minimum width in the design rules applied when the present solid-state imaging device is produced Thus, it can be easily imagined that the capacitive coupling between adjacent pixel electrodes 5 is large. In order to reduce the capacitive coupling, it is necessary to increase the distance between adjacent pixel electrodes 5, or decrease the thickness of the pixel electrode 5. Increasing the distance between adjacent pixel electrodes 5 is not desirable because there is a high possibility that a charge generated by the photoelectric conversion film 6 above the pixel electrodes 5 may serve as a signal to the adjacent pixel electrodes 5, thereby causing deterioration of resolution. Thus, the capacitance between adjacent pixel electrodes 5 is proportional to the thickness of the pixel electrode 5. In order to reduce the capacitive coupling, the thickness of the pixel electrode 5 is made thinner than the thickness of wiring. By using a material for the pixel electrode 5 different from that of the wiring, the capacitive coupling between pixel electrodes 5 can be reduced.

As described above, with the solid-state imaging device according to Embodiment 5 of the present invention, the capacitive coupling between the pixel electrode 5 of a predetermined unit pixel cell 13, and the pixel electrode 5 of other unit pixel cell 13 adjacent to the predetermined unit pixel cell 13 in the row direction can be reduced.

Embodiment 6

Hereinafter, a solid-state imaging device according to a sixth embodiment of the present invention will be described with reference to the accompanying drawings. The features of Embodiment 6 which differ from those of Embodiment 2 will be mainly described below.

Figure 8:
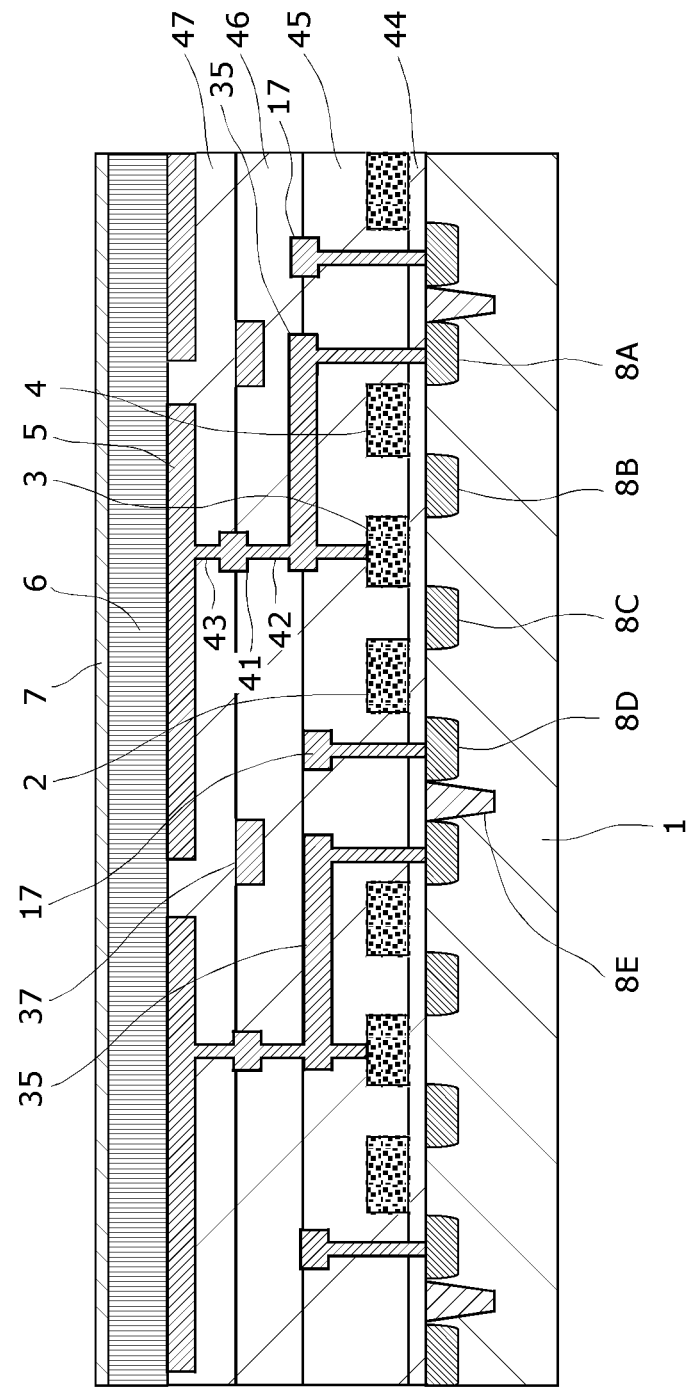
FIG. 8 is a cross-sectional view illustrating a detailed configuration of a unit pixel cell of a solid-state imaging device according to Embodiment 6 of the present invention.

FIG. 8 is a cross-sectional view illustrating a detailed configuration of a unit pixel cell 13 of a solid-state imaging device according to the present embodiment.

The above solid-state imaging device differs from the solid-state imaging device according to Embodiment 2 in that the unit pixel cell 13 is located below the pixel electrode 5 of other unit pixel cell 13 adjacent to the unit pixel cell 13, and has a pixel local wiring 35 which connects between the amplification transistor 10 of the unit pixel cell 13, and the reset transistor 11. The pixel local wiring 35 includes wiring in a wiring layer other than a wiring layer in the uppermost region of the multi-layered wiring layer provided between the amplification transistor 10, the reset transistor 11, and the pixel electrode 5. Specifically, the pixel local wiring 35 includes wiring in the lowermost region of the multi-layered wiring layer provided between the amplification transistor 10, the reset transistor 11, and the pixel electrode 5. The shielding electrode 37 for reducing the capacitive coupling is provided between the pixel electrode 5 and the pixel local wiring 35 located below the pixel electrode 5.

Here, a solution to the capacitive coupling between the pixel electrode 5 and wiring layers electrically connected to the adjacent pixel electrode 5 will be described.

Figure 9:
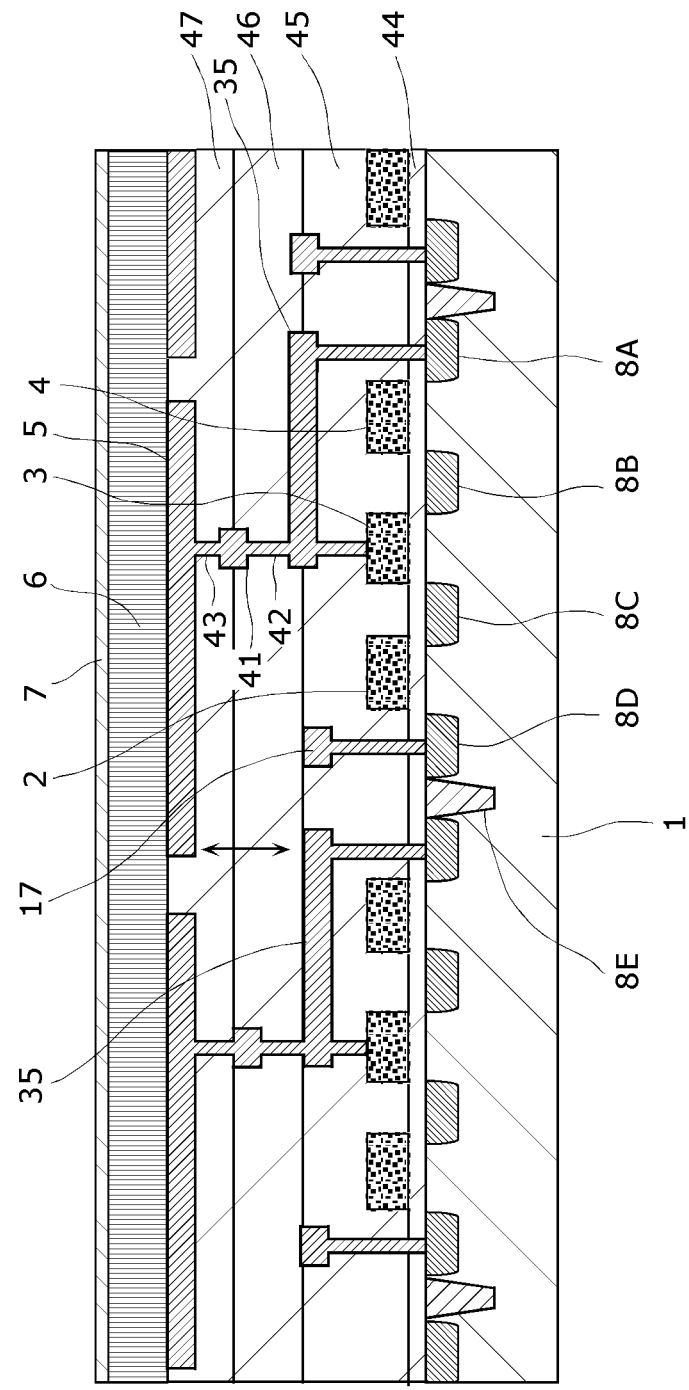
FIG. 9 is a cross-sectional view illustrating a detailed configuration of a unit pixel cell of a solid-state imaging device according to Embodiment 6 of the present invention.

As a finer structure of the unit pixel cell 13 is sought, the degree of freedom in choosing the layout is decreased, and thus, as illustrated in FIG. 9, the pixel local wiring 35 and the pixel electrode 5 of the adjacent unit pixel cell 13 may overlap with each other when viewed from the top. In this case, it is effective to provide the shielding electrode 37 between the pixel local wiring 35 and the pixel electrode 5 as illustrated in FIG. 8. Because the purpose of disposing the shielding electrode 37 is to reduce the capacitive coupling, the pixel local wiring 35 does not need to be completely shielded from the pixel electrode 5 two-dimensionally by the shielding electrode 37. Thus, instead of the shielding electrode 37, another wiring of the solid-state imaging device may be used as the shielding electrode 37. For example, the wiring of the gate electrode 4 of the reset transistor 11, the power source wiring of the reset transistor 11 and the amplification transistor 10, and/or the wiring of the gate electrode 2 of the address transistor 12 may be used as the shielding electrode 37.

As described above, with the solid-state imaging device according to Embodiment of the present invention, the capacitive coupling between the pixel electrode 5 of a predetermined unit pixel cell 13, and the pixel local wiring 35 of other unit pixel cell 13 adjacent to the predetermined unit pixel cell 13 in the row direction can be reduced.

Comparative Example

Hereinafter, a solid-state imaging device according to a comparative example for Embodiments 1 to 6 of the present invention will be described with reference to the accompanying drawings.

Figure 10:
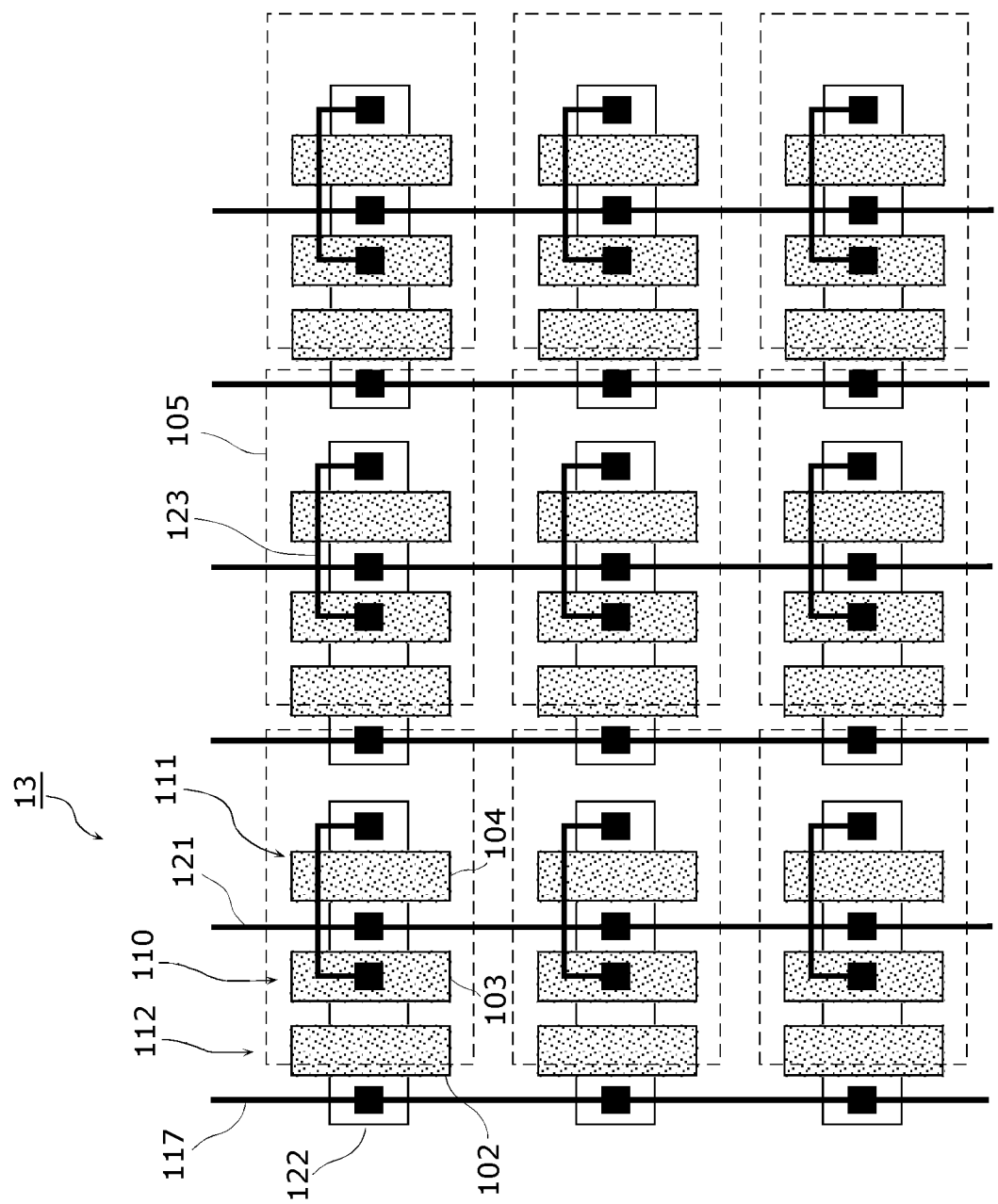
FIG. 10 is a plan view illustrating a detailed configuration of a unit pixel cell of a solid-state imaging device according to a comparative example for Embodiments 1 to 6 of the present invention.
Figure 11:
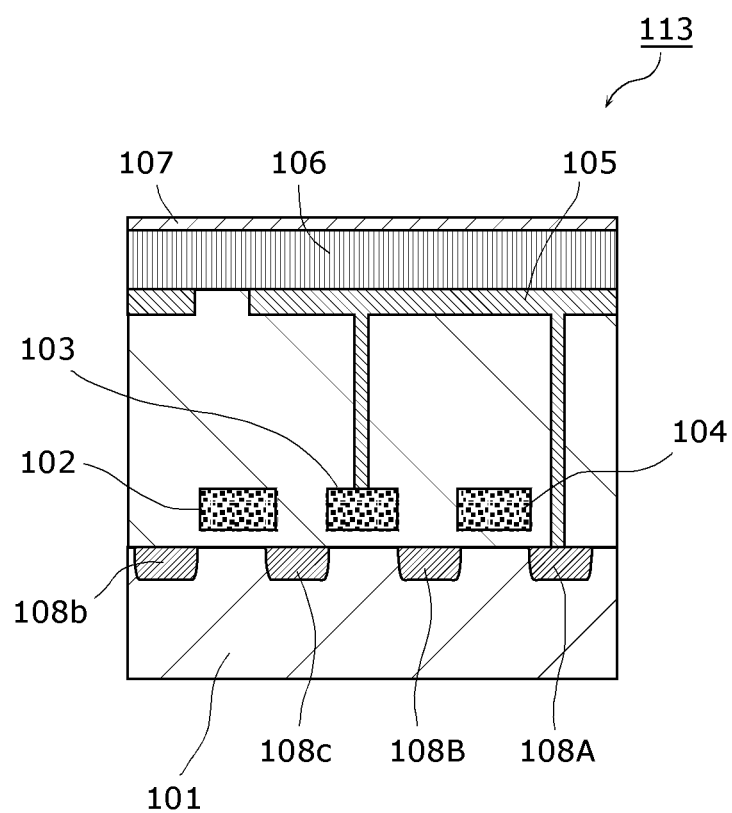
FIG. 11 is a cross-sectional view illustrating a detailed configuration of a unit pixel cell of a solid-state imaging device according to a comparative example for Embodiments 1 to 6 of the present invention.

FIG. 10 is a plan view illustrating a configuration of arranging 3×3 unit pixel cells in a solid-state imaging device according to the present comparative example. FIG. 11 is a cross-sectional view illustrating a detailed configuration of a unit pixel cell of a solid-state imaging device according to the present comparative example.

As illustrated in FIG. 10, in the unit pixel cell, the inside of a first active region 122 formed in a semiconductor substrate includes active regions of an amplification transistor 110, a reset transistor 111, and an address transistor 112. On the first active region 122, there are provided a gate electrode 102 of the address transistor 112, a gate electrode 103 of the amplification transistor 110, and a gate electrode 104 of the reset transistor 111. The amplification transistor 110, the reset transistor 111, and the address transistor 112 are connected to wiring (thick line in FIG. 10) such as a power source wiring 121, and a vertical signal line 117.

As illustrated in FIG. 11, in the unit pixel cell, the reset transistor 111 includes n-type diffusion layer regions 108A, 108B formed in the p-type silicon substrate 101, and the gate electrode 104 formed on the p-type silicon substrate 101. Similarly, the amplification transistor 110 includes n-type diffusion layer regions 108B, 108C formed in the p-type silicon substrate 101, and the gate electrode 103 formed on the p-type silicon substrate 101. Furthermore, the address transistor 112 includes n-type diffusion layer regions 108C, 108D formed in the p-type silicon substrate 101, and the gate electrode 102 formed on the p-type silicon substrate 101.

The n-type diffusion layer region 108A serves as the source of the reset-transistor 111, and the n-type diffusion layer region 108B serves as the drain of the reset transistor 111 and the amplification transistor 110. The n-type diffusion layer region 108C serves as the source of the amplification transistor 110, and as the drain of the address transistor 112, and the n-type diffusion layer region 108D serves as the source of the address transistor 112.

A pixel electrode 105, a photoelectric conversion film 106, and a transparent electrode 107 are successively layered over the pixel circuit comprising those three transistors, i.e., the address transistor 112, the amplification transistor 110, and the reset transistor 111.

The pixel electrode 105 is connected via a contact to the gate electrode 103 of the amplification transistor 110, and the n-type diffusion layer region 108A which serves as the source of the reset transistor 111. The n-type diffusion layer region 108A connected to the pixel electrode 105 also serves as an accumulation diode.

In the above, the conductivity type of the silicon substrate 101 is p-type, and each transistor is n-channel type, however, the conductivity type of the silicon substrate 101 may be n-type, and each transistor may be n-channel type. In this case, the symbols for voltage potential are reversed.

As illustrated in FIG. 10, the pixel electrode 105 is arranged in such a manner that a pixel electrode wiring 123 which connects between the gate electrode 103 of the amplification transistor 110, and the source and drain of the reset transistor 111 is disposed as the central portion.

A problem with the layout of FIG. 10 is that the vertical signal line 117 disposed correspondingly to a predetermined unit pixel cell, and the pixel electrode 105 of the unit pixel cell adjacent to the predetermined unit pixel cell overlap with each other two-dimensionally. The overlap has a large capacitive coupling and causes deterioration of image characteristics. In the configuration of FIG. 10, the unit pixel cells are simultaneously addressed horizontally in FIG. 10, thus capacitive coupling between the horizontally-adjacent unit pixel cells causes a problem. However, either one of signals from adjacent unit pixel cells in the vertical direction of FIG. 10 is not read at the same timing, and thus no problem is caused. The reason why the above-mentioned problem is likely to occur is that the vertical signal line 117 is often arranged at the very end of the unit pixel cell. As the size of the unit pixel cell is reduced, the degree of freedom in choosing a layout tends to decrease.

In addition, the pixel electrodes 105 of adjacent unit pixel cells are also close to each other, and therefore, the capacitance between the pixel electrodes 105 also causes a problem. The capacitance between pixel electrodes 105 causes a problem not only in the horizontal direction but also in the vertical direction. The reason for this is because the pixel electrode 105 of a unit pixel cell from which a signal is not read also has a signal component of a voltage.

The solid-state imaging devices according to Embodiments 1 to 6 can solve above-mentioned problems, and reduce the capacitive coupling.

In the above, the solid-state imaging devices according to aspects of the present invention have been described based on the respective embodiments, however, the present invention is not limited to these embodiments. Various modifications which may occur to those skilled in the art may be made without departing from the scope of the present invention and those modifications are also included in the invention. In addition, components in several embodiments may be combined in any manner without departing from the spirit of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention can be used for a layered solid-state imaging device, and particularly for a small-sized image pickup device and the like.

The invention claimed is:

1. A solid-state imaging device comprising
a plurality of unit pixel cells arranged in a two-dimensional array, and
each of the pixel units cell including:
   a photoelectric conversion film which is formed above a semiconductor substrate and photoelectrically converts an incident light;
   a pixel electrode which is formed above the semiconductor substrate and is in contact with the photoelectric conversion film;
   an amplification transistor which is formed on the semiconductor substrate, has a gate electrode connected to the pixel electrode, and outputs a signal voltage according to a potential of the pixel electrode;
   a reset transistor which is formed on the semiconductor substrate, and resets a potential of the gate electrode of the amplification transistor;
   a via contact for connecting the gate electrode of the amplification transistor to the pixel electrode; and
   connection wiring for connecting the reset transistor to the pixel electrode and the gate electrode of the amplification transistor,
the reset transistor being connected to the pixel electrode via the via contact and the connection wiring, and
the reset transistor being located below the pixel electrode and closer to an edge of the pixel electrode than a connection point between the via contact and the pixel electrode,
the solid-state imaging device further comprising:
   a vertical signal line which is provided correspondingly to a column of the unit pixel cells, and transmits a signal voltage of the unit pixel cells of the corresponding column; and
   a row selection unit configured to select a row of the unit pixel cells having a signal voltage to be outputted to the vertical signal line.

2. The solid-state imaging device according to claim 1, wherein the vertical signal line includes wiring in a wiring layer other than a wiring layer in an uppermost region of a multi-layered wiring layer provided between (i) the amplification transistor and the reset transistor, and (ii) the pixel electrode.

3. The solid-state imaging device according to claim 2, wherein the vertical signal line includes wiring in a lowermost region of the multi-layered wiring layer provided between (i) the amplification transistor and the reset transistor, and (ii) the pixel electrode.

4. The solid-state imaging device according to claim 3, wherein the connection wiring includes wiring in a wiring layer in the lowermost region of the multi-layered wiring layer provided between (i) the gate electrode of the amplification transistor and a gate electrode of the reset transistor, and (ii) the pixel electrode.

5. The solid-state imaging device according to claim 1, wherein the unit pixel cell has:
   a first wiring layer located above the gate electrode of the amplification transistor and a gate electrode of the reset transistor; and
   a second wiring layer located above the first wiring layer, and
   the connection wiring is provided in the first wiring layer.

6. The solid-state imaging device according to claim 1, wherein the vertical signal line is located below the pixel electrodes of the unit pixel cells corresponding to the vertical signal line.

7. A solid-state imaging device comprising
a plurality of unit pixel cells arranged in a two-dimensional array, and
each of the pixel units cell including:
   a photoelectric conversion film which is formed above a semiconductor substrate and photoelectrically converts an incident light;
   a pixel electrode which is formed above the semiconductor substrate and is in contact with the photoelectric conversion film;
   an amplification transistor which is formed on the semiconductor substrate, has a gate electrode connected to the pixel electrode, and outputs a signal voltage according to a potential of the pixel electrode; and
   a reset transistor which is formed on the semiconductor substrate, and resets a potential of the gate electrode of the amplification transistor,
the solid-state imaging device further comprising:
   a vertical signal line which is provided correspondingly to a column of the unit pixel cells and transmits a signal voltage of the unit pixel cells of the corresponding column; and
   a row selection unit configured to select a row of the unit pixel cell having a signal voltage to be outputted to the vertical signal line,
wherein the vertical signal line is located below the pixel electrodes of the unit pixel cell adjacent to the unit pixel cells corresponding to the vertical signal line, and
includes wiring in a wiring layer other than a wiring layer in an uppermost region of a multi-layered wiring layer provided between (i) the amplification transistor and the reset transistor, and (ii) the pixel electrode.

8. The solid-state imaging device according to claim 7, wherein the vertical signal line includes wiring in a lowermost region of the multi-layered wiring layer provided between (i) the amplification transistor and the reset transistor, and (ii) the pixel electrode.

9. A solid-state imaging device comprising
a plurality of unit pixel cells arranged in a two-dimensional array, and each of the pixel units cell including:
    a photoelectric conversion film which is formed above a semiconductor substrate and photoelectrically converts an incident light;
    a pixel electrode which is formed above the semiconductor substrate and is in contact with the photoelectric conversion film;
    an amplification transistor which is formed on the semiconductor substrate, has a gate electrode connected to the pixel electrode, and outputs a signal voltage according to a potential of the pixel electrode; and
    a reset transistor which is formed on the semiconductor substrate, and resets a potential of the gate electrode of the amplification transistor,
the solid-state imaging device further comprising:
    a vertical signal line which is provided correspondingly to a column of the unit pixel cells and transmits a signal voltage of the unit pixel cells of the corresponding column; and
    a row selection unit configured to select a row of the unit pixel cell having a signal voltage to be outputted to the vertical signal line,
    wherein the vertical signal line is located below the pixel electrode of the unit pixel cell adjacent to the unit pixel cell corresponding to the vertical signal line, and
    a shielding electrode which reduces capacitive coupling between the pixel electrode and the vertical signal line located below the pixel electrode is provided therebetween.

10. The solid-state imaging device according to claim 9, wherein the shielding electrode is wiring in the amplification transistor or the reset transistor.

11. A solid-state imaging device comprising
a plurality of unit pixel cells arranged in a two-dimensional array, and
each of the pixel units cell including:
    a photoelectric conversion film which is formed above a semiconductor substrate and photoelectrically converts an incident light;
    a pixel electrode which is formed above the semiconductor substrate and is in contact with the photoelectric conversion film;
    an amplification transistor which is formed on the semiconductor substrate, has a gate electrode connected to the pixel electrode, and outputs a signal voltage according to a potential of the pixel electrode;
    a reset transistor which is formed on the semiconductor substrate, and resets a potential of the gate electrode of the amplification transistor; and
    wiring which electrically connects the amplification transistor, the reset transistor, and the selection transistor,
the solid-state imaging device further comprising:
    a vertical signal line which is provided correspondingly to a column of the unit pixel cells and transmits a signal voltage of the unit pixel cells of the corresponding column; and
    a row selection unit configured to select a row of the unit pixel cell having a signal voltage to be outputted to the vertical signal line,
    wherein a thickness of the pixel electrode is less than a thickness of the wiring.

12. The solid-state imaging device according to claim 11, wherein an insulating layer is disposed between the pixel electrode and the wiring, so that the pixel electrode satisfies the following relationship:
$$s < p \times W/T$$
where W is a width of wiring, T is a film pressure of the insulating layer, s is the thickness of the pixel electrode, and p is a distance between the pixel electrodes of the unit pixel cells adjacent to each other.

13. A solid-state imaging device comprising
a plurality of unit pixel cells arranged in a two-dimensional array,
each of the pixel units cell including:
    a photoelectric conversion film which is formed above a semiconductor substrate and photoelectrically converts an incident light;
    a pixel electrode which is formed above the semiconductor substrate and is in contact with the photoelectric conversion film;
    an amplification transistor which is formed on the semiconductor substrate, has a gate electrode connected to the pixel electrode, and outputs a signal voltage according to a potential of the pixel electrode; and
    a reset transistor which is formed on the semiconductor substrate, and resets a potential of the gate electrode of the amplification transistor through connection wiring connecting the amplification transistor and the reset transistor, at least a part of the connection wiring being located below a pixel electrode of an adjacent unit pixel cell,
the solid-state imaging device further comprising:
    a vertical signal line which is provided correspondingly to a column of the unit pixel cells and transmits a signal voltage of the unit pixel cells of the corresponding column; and
    a row selection unit configured to select a row of the unit pixel cell having a signal voltage to be outputted to the vertical signal line,
wherein
    the connection wiring includes wiring in a wiring layer other than a wiring layer in an uppermost region of a multi-layered wiring layer provided between (i) the amplification transistor and the reset transistors, and (ii) the pixel electrode.

14. The solid-state imaging device according to claim 13, wherein the connection wiring includes wiring in a lowermost region of the multi-layered wiring layer provided between (i) the amplification transistor and the reset transistor, and (ii) the pixel electrode.

15. The solid-state imaging device according to claim 13, wherein a shielding electrode which reduces capacitive coupling between the pixel electrode and the connection wiring located below the pixel electrode is provided therebetween.

16. The solid-state imaging device according to claim 15, wherein the shielding electrode is wiring in the amplification transistor, the reset transistor, or the selection transistor.

* * * * *